June 14, 1960 J. N. BARRY 2,941,070

CONSTANTLY FORWARD BIASED NON-LINEAR ELEMENT ACROSS DETECTOR INPUT FOR CONTROLLING GAIN AUTOMATICALLY

Filed May 31, 1955

United States Patent Office 2,941,070

Patented June 14, 1960

2,941,070

CONSTANTLY FORWARD BIASED NON-LINEAR ELEMENT ACROSS DETECTOR INPUT FOR CONTROLLING GAIN AUTOMATICALLY

John Norman Barry, Wembley, England, assignor to Hazeltine Research, Inc., Chicago, Ill., a corporation of Illinois Filed May 31, 1955, Ser. No. 512,067

Claims priority, application Great Britain June 1, 1954

8 Claims. (Cl. 250—20)

*General*

Figure 1:
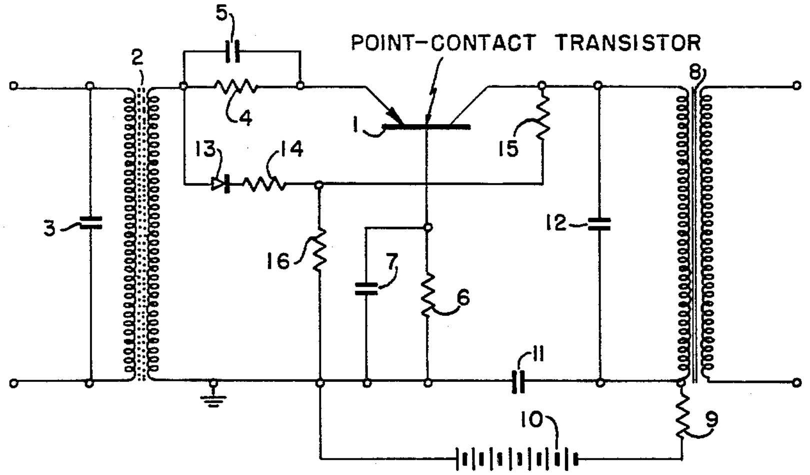

This invention relates to detector-amplifier systems and, more particularly, to such systems which include a single transistor in each thereof and afford automatic gain control.

In conventional transistor detector-amplifier circuits, an amplitude-modulated radio-frequency oscillation or wave signal is applied between the emitter and base electrodes of the transistor. These electrodes effectively act as a diode and rectify the applied wave signal, thereby deriving the modulation components thereof. The rectified signal thus produced is amplified by the action of the transistor as a whole so that amplified modulation components may be derived from the collector circuit of the transistor.

For some applications, such as in the second or modulation-signal detector of a transistor-type radio receiver, it is desirable that the average amplitude of the amplified modulation components be maintained within a relatively narrow range for a wide range of intensities of the received wave signal. Heretofore, such an automatic-gain-control action has not been realized with a transistor-type detector amplifier employed as a modulation-signal detector.

It is an object of the present invention, therefore, to provide a new and improved detector-amplifier system which is effective to maintain the average amplitude of the amplified replica of the detected signal within a relatively narrow range for a wide range of intensities of the wave signal applied to that system.

It is another object of the invention to provide a single transistor detector-amplifier system affording automatic gain control.

In accordance with the invention, a detector-amplifier system with automatic gain control comprises a transistor including emitter and base input connections and collector and base output connections. The system also includes an input circuit coupled to those input connections for supplying thereto an amplitude-modulated wave signal and for deriving the modulation components by rectification in that circuit. The system further includes an output circuit coupled to the aforesaid output connections for deriving an amplified replica of the modulation components. The detector-amplifier system additionally includes input circuit means, coupled across the aforesaid input circuit and including a source of a substantially constant unidirectional biasing voltage rendering the input circuit means conductive both normally and in the absence of the wave signal, and having a value of impedance which varies inversely with the amplitude of the supplied wave signal for causing the amplitude of the wave signal applied to the input connections to vary more slowly than the amplitude of the supplied wave signal, thereby to maintain the average amplitude of the amplified replica within a relatively narrow range for a wide range of intensities of the supplied wave signal.

For a better understanding of the present invention, together with other and further objects thereof, reference is had to the following description taken in connection with the accompanying drawing, and its scope will be pointed out in the appended claims.

Figure 2:
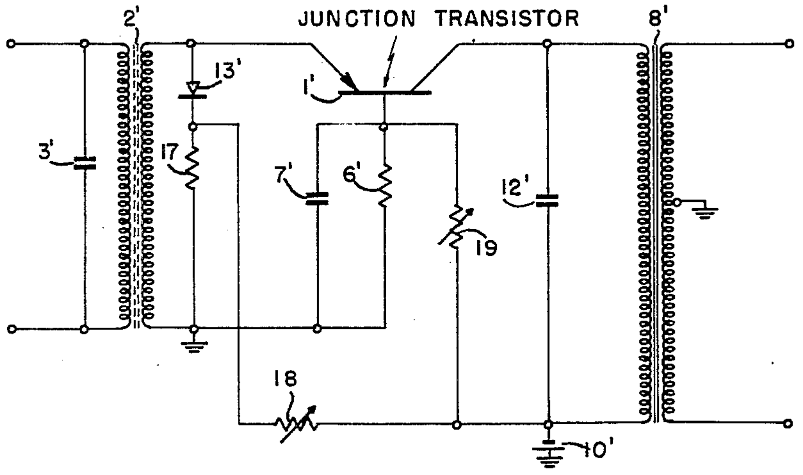

Referring to the drawing:

Fig. 1 is a circuit diagram of a portion of a radio receiver including a detector-amplifier system in accordance with the present invention and employing a point-contact transistor, and Fig. 2 is a similar circuit diagram for a detector-amplifier system in accordance with another form of the invention which employs a junction transistor.

*Description of Fig. 1 detector-amplifier system*

Referring now more particularly to Fig. 1 of the drawing, the portion of the receiver there represented includes a transistor detector-amplifier system comprising a point-contact transistor 1 which includes emitter and base input connections and collector and base output connections. The system includes an input circuit which is coupled to the input connections and is fed with an amplitude-modulated wave signal via an intermediate-frequency transformer 2 that has its primary winding tuned by a condenser 3. One end of the secondary winding of the transformer 2 is earthed and the other end is connected to the emitter connection of the transistor 1 via a resistor 4 by-passed by a condenser 5. The base connection of the transistor 1 is connected to earth via a bias resistor 6 by-passed by a condenser 7. The detector-amplifier system also includes an output circuit coupled to the aforesaid output connections for deriving an amplified replica of the modulation components derived in the input circuit of the transistor. The collector connection of the transistor 1 is connected via the primary winding of an output transformer 8 and a resistor 9 to the negative terminal of a constant voltage source 10 whose positive terminal is earthed, the junction of the resistor 9 and the primary winding of the transformer 8 being earthed with regard to alternating currents by means of a condenser 11. The primary winding of the transformer 8 is by-passed at radio frequencies by means of a condenser 12 and the secondary winding of the transformer 8 is connected to the input of an audio-frequency amplifier (not shown). The detector-amplifier system includes input circuit means in the form of a control circuit coupled across the input circuit of transistor 1 and having a value of impedance which varies inversely with the amplitude of the wave signal supplied by transformer 2 for causing the amplitude of the wave signal applied to the input connections to vary more slowly than the amplitude of said supplied wave signal, thereby to maintain the average amplitude of the aforesaid amplified replica within a relatively narrow range for a wide range of intensities of the supplied wave signal.

This control circuit includes a unilaterally conductive device such as a crystal diode 13 effectively in parallel with the input of the system, the crystal diode 13 being connected in the same sense as the diode formed by the emitter and base connections of the transistor 1 and being biased in the conducting direction by having one of its electrodes connected through a resistor 14 to an intermediate point on a potentiometer constituted by resistors 15 and 16 connected in series between the collector of the transistor 1 and earth. Resistor 15 presents an impedance which is large with respect to that of resistors 14 and 16. The battery 10 and the potentiometer constitute a source of substantially constant unidirectional biasing voltage for the diode 13 for rendering it conductive both normally and in the absence of the applied wave signal.

The detector-amplifier system further includes emitter-current control means in the input circuit of transistor 1 proportioned to establish a value of emitter current which provides an approximately peak value of current gain factor when the emitter current is representative of a predetermined or minimum usable amplitude of the supplied wave signal and for providing a lesser value of current gain factor when the emitter current is representative of an amplitude of that supplied wave signal that is different from, i.e. larger than, the predetermined amplitude, whereby the average amplitude of the modulation components is maintained within a relatively narrow range for a wide range of intensities of the supplied wave signal. It is known that the current gain factor (α) of a point-contact transistor varies with the emitter current, the current gain factor displaying a peak value at a low value of emitter current and decreasing from the peak value to a constant value for higher values of emitter current. According to the present invention, a transistor detector circuit utilizing a point-contact transistor includes means for biasing the transistor so that in the absence of an input signal the emitter current has a value below that corresponding to the peak value of the current gain factor. The values of the resistors 6 and 4 are chosen so that the emitter current flowing in the transistor 1 has a value corresponding to the peak value of the current gain factor of the transistor 1 when the received signal has its minimum usable amplitude.

*Operation of Fig. 1 detector-amplifier system*

In operation of the circuit, the emitter and base of the transistor 1 effectively act as a diode to rectify the amplitude-modulated wave signal applied to the system by the transformer 2 and the rectified signal thus produced is amplified by the action of the transistor 1 as a whole so that the amplified modulation components are fed via the transformer 8 to the audio-frequency amplifier. An increase of the amplitude of the received signal above its minimum usable value will result in an increase in the emitter current in the transistor 1 and consequently in a decrease of the current gain factor. Thus over a range of amplitudes of the input signal, the amplitude of the modulation components in the output circuit of the system will not increase in proportion to the amplitude of the input signal but will remain approximately constant, thereby providing a measure of automatic gain control in the receiver.

The effective impedance of the crystal diode 13 to the input signal varies inversely with the amplitude of the input signal so that the amplitude of the signal actually applied to the input of the detector circuit will vary more slowly than the amplitude of the received signal. This effect is enhanced by the fact that the input impedance of the transistor 1 decreases as the emitter current increases and thus also varies inversely with the amplitude of the input signal.

In one circuit which has been used in practice, the transistor 1 and crystal diode 13 were respectively of the types GET 1 and GEX 66 manufactured by The General Electric Company Limited of Great Britain and the source 10 had a voltage of 24 volts. Suitable values for the circuit components were found to be:

| | | |
|---|---|---|
| Resistor **4** | ohms | 1200 |
| Resistor **6** | do | 180 |
| Resistor **9** | do | 4700 |
| Resistor **14** | do | 270 |
| Resistor **15** | do | 27,000 |
| Resistor **16** | do | 220 |
| Condenser **5** | microfarads | 0.05 |
| Condenser **7** | do | 0.25 |
| Condenser **11** | do | 0.25 |
| Condenser **12** | do | 0.04 |

Using such a circuit, it was found that a variation of approximately 40 decibels in the level of the received signal produced a variation of approximately 5 decibels in the level of the modulation-frequency output signal.

*Description and operation of Fig. 2 detector-amplifier system*

Referring now to Fig. 2 of the drawing, there is represented a detector-amplifier system which is generally similar to that of Fig. 1. Accordingly, corresponding elements are designated by the same reference numerals primed. The Fig. 2 system employs a junction transistor 1' instead of a point-contact transistor as in Fig. 1. The control circuit effectively coupled in shunt with the input circuit of the detector-amplifier system of Fig. 2 includes the crystal diode 13' in series with a resistor 17 having a relatively low impedance of about 50 ohms. The junction of the diode 13' and the resistor 17 is connected through an adjustable resistor 18 to the negative terminal of the source 10' so that the diode is biased in its conducting direction. An adjustable resistor 19 is connected between the negative terminal of the source 10' and the base connection of the transistor 1' to supply the proper operating biases for the transistor. The resistor 19 is adjusted so that the standing emitter bias, that is the bias with no signal applied to the input circuit of the transistor, is not so low that the current gain factor becomes too low during operation of the system.

The over-all operation of the system of Fig. 2 is similar to that of Fig. 1. A smaller reduction in the current gain factor takes place in the Fig. 2 system than that in the Fig. 1 system. This reduction combined with the decreased input circuit resistance as the amplitude of the wave signal supplied by the transformer 2' increases is effective to maintain the average amplitude of the amplified replica appearing in the transformer 8' within a relatively narrow range for a wide range of supplied wave-signal intensities.

While applicant does not wish to be limited to any particular set of circuit constants, the following constants have proved to be useful in a detector-amplifier system of the type represented in Fig. 2:

| | |
|---|---|
| Resistor **6'** | 100 ohms. |
| Resistor **17** | 47 ohms. |
| Resistors **18, 19** | 47 kilohms (max.). |
| Condenser **7'** | 0.25 microfarad. |
| Condenser **12'** | 0.04 microfarad. |
| Transistor **1'** | General Electric Company Limited Type EW52 germanium junction triode. |
| Diode **13'** | General Electric Company Limited Type GEX66 germanium diode |
| Source **10'** | 7.5 volts. |
| Standing emitter-current bias | 0.8–0.9 milliampere. |

With the above circuit constants, an input carrier level variation of greater than 25 decibels resulted in a 6 decibel variation in audio output signal level.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. A detector-amplifier system with automatic gain control comprising: a transistor including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said components; and input circuit means, coupled across said input circuit and including a source of a substantially constant unidirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal, thereby to maintain the average amplitude of said amplified replica within a relatively narrow range for a wide range of intensities of said supplied wave signal.

2. A detector-amplifier system with automatic gain control comprising: a transistor including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said components; and a control circuit, coupled across said input circuit and including a unilaterally conductive device and a source of substantially constant unidirectional biasing voltage rendering said device conductive both normally and in the absence of said signal, and having a value of impedance which varies inversely with the amplitude of said supplied wave signal for causing the amplitude of the wave signal applied to said input connections to vary more slowly than the amplitude of said supplied wave signal, thereby to maintain the average amplitude of said amplified replica within a relatively narrow range for a wide range of intensities of said supplied wave signal.

3. A detector-amplifier system with automatic gain control comprising: a point-contact transistor including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said components; and a control circuit, effectively coupled in parallel with said input circuit and including a unilaterally conductive device and a source of a substantially constant unidirectional biasing voltage rendering said device conductive both normally and in the absence of said signal, and having a value of impedance which varies inversely with the amplitude of said supplied wave signal for causing the amplitude of the wave signal applied to said input connections to vary more slowly than the amplitude of said supplied wave signal, thereby to maintain the average amplitude of said amplified replica within a relatively narrow range for a wide range of intensities of said supplied wave signal.

4. A detector-amplifier system with automatic gain control comprising: a junction transistor including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said components; and input circuit means, coupled across said input circuit and including a source of a substantially constant unidirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal, thereby to maintain the average amplitude of said amplified replica within a relatively narrow range for a wide range of intensities of said supplied wave signal.

5. A detector-amplifier system with automatic gain control comprising: a transistor having a nonlinear emitter-current current gain factor characteristic and including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said componets; input circuit means, coupled across said input circuit and including a source of a substantially constant undirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal; and emitter-current control means in said input circuit proportioned to establish a value of emitter current which provides an approximately peak value of current-gain factor when said emitter current is representative of a predetermined amplitude of said supplied wave signal and for providing a lesser value of current-gain factor when said emitter current is representative of an amplitude of said supplied wave signal different from said predetermined amplitude, whereby the average amplitude of said amplified modulation components is maintained within a relatively narrow range for a wide range of intensities of said supplied wave signal.

6. A detector-amplifier system with automatic gain control comprising: a point-contact transistor having a nonlinear emitter-current current gain factor characteristic and including emitter and base input connections and collector and base output connections; an input circuit coupled to said input connections for supplying thereto an amplitude-modulated wave signal and for deriving the modulation components by rectification in said circuit; an output circuit coupled to said output connections for deriving an amplified replica of said components; input circuit means, coupled across said input circuit and including a source of a substantially constant unidirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal; and emitter-current control means in said input circuit proportioned to establish a value of emitter current which provides an approximately peak value of current-gain factor when said emitter current is representative of a predetermined amplitude of said supplied wave signal and for providing a lesser value of current-gain factor when said emitter current is representative of a larger amplitude of said supplied wave signal, whereby the average amplitude of said amplified modulation components is maintained within a relatively narrow range for a wide range of intensities of said supplied wave signal.

7. A detector-amplifier system with automatic gain control comprising: a junction transistor having a non-linear emitter-current current gain factor characteristic and including emitter and base input connection and collector and base output connections; an input circuit coupled to said input connections for supplying thereto an amplitude-modulated wave signal and for deriving the modulation components by rectification in said circuit; an output circuit coupled to said output connections for deriving an amplified replica of said components; input circuit means, coupled across said input circuit and including a source of a substantially constant unidirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal; and emitter-current control means in said input circuit proportioned to establish a value of emitter current which provides an approximately peak value of current-gain factor when said emitter current is representative of a predetermined amplitude of said supplied wave signal and for providing a lesser value of current-gain factor when said emitter current is representative of an amplitude of said supplied wave signal larger than said predetermined amplitude, whereby the average amplitude of said amplified modulation components is maintained within a relatively narrow range for a wide range of intensities of said supplied wave signal.

8. A detector-amplifier system with automatic gain control comprising: a point-contact transistor having a nonlinear emitter-current current gain factor characteristic and including emitter and base input connections and collector and base output connections; an input circuit coupled to said input connections including a source for supplying thereto an amplitude-modulated wave signal and for deriving the modulation components by rectification in said circuit; an output circuit coupled to said output connections for deriving an amplified replica of said components; input circuit means, coupled across said input circuit and including a source of a substantially constant unidirectional biasing voltage rendering said input circuit means conductive both normally and in the absence of said signal, and having a value of impedance which varies inversely with the amplitude of said supplied wave signal for causing the amplitude of the wave signal applied to said input connections to vary more slowly than the amplitude of said supplied wave signal; and emitter-current control means in said input circuit including a first resistor connected between said emitter connection and said source and a second resistor connected between said base connection and said source and proportioned to establish a value of emitter current which provides an approximately peak value of current-gain factor when said emitter current is representative of a minimum usable amplitude of said supplied wave signal and for providing a lesser value of current-gain factor when said emitter current is representative of a larger amplitude of said supplied wave signal, whereby the average amplitude of said amplified modulation components is maintained within a relatively narrow range for a wide range of intensities of said supplied wave signal.

References Cited in the file of this patent

UNITED STATES PATENTS

| | | |
|---|---|---|
| 1,737,992 | Bostwick | Dec. 3, 1929 |
| 2,548,913 | Schreiner et al. | Apr. 17, 1951 |
| 2,595,208 | Bangert | Apr. 29, 1952 |
| 2,629,834 | Trent | Feb. 24, 1953 |
| 2,655,610 | Ebers | Oct. 13, 1953 |
| 2,662,976 | Pankove | Dec. 15, 1953 |
| 2,703,825 | Macdonald | Mar. 8, 1955 |
| 2,793,303 | Fleisher | May 21, 1957 |

FOREIGN PATENTS

| | | |
|---|---|---|
| 413,383 | Great Britain | July 19, 1934 |

OTHER REFERENCES

"Transistor Broadcast Receivers," by Stern & Raper Electrical Engineering, December 1954, pages 1107–1112 (only page 1110 cited). Revised text of a paper presented to I.R.E. Convention in March 1954.